(12) United States Patent
Liao

(10) Patent No.: US 11,670,712 B2
(45) Date of Patent: *Jun. 6, 2023

(54) SEMICONDUCTOR DEVICE STRUCTURE AND METHOD FOR MANUFACTURING THE SAME

(71) Applicant: Silergy Semiconductor Technology (Hangzhou) LTD, Hangzhou (CN)

(72) Inventor: Zhongping Liao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/366,439

(22) Filed: Jul. 2, 2021

(65) Prior Publication Data

US 2021/0336053 A1  Oct. 28, 2021

Related U.S. Application Data

(63) Continuation of application No. 14/864,340, filed on Sep. 24, 2015, now Pat. No. 11,088,274.

(30) Foreign Application Priority Data

Oct. 24, 2014 (CN) .......................... 201410578050.8

(51) Int. Cl.
| | |
|---|---|
| *H01L 29/06* | (2006.01) |
| *H01L 29/08* | (2006.01) |
| *H01L 29/10* | (2006.01) |
| *H01L 29/78* | (2006.01) |
| *H01L 29/66* | (2006.01) |

(Continued)

(52) U.S. Cl.
CPC ...... *H01L 29/7813* (2013.01); *H01L 29/0634* (2013.01); *H01L 29/0878* (2013.01); *H01L 29/407* (2013.01); *H01L 29/66712* (2013.01); *H01L 29/66734* (2013.01);

(Continued)

(58) Field of Classification Search
CPC ............. H01L 29/0634; H01L 29/0878; H01L 29/1095; H01L 29/407; H01L 29/66712; H01L 29/66734; H01L 29/7397; H01L 29/7802; H01L 29/7813

See application file for complete search history.

(56) References Cited

U.S. PATENT DOCUMENTS

| | | |
|---|---|---|
| 8,633,540 B2 | 1/2014 | Lotfi et al. |
| 8,963,217 B2 | 2/2015 | Liao |

(Continued)

*Primary Examiner* — Meiya Li

(57) ABSTRACT

A semiconductor device structure can include: (i) a first semiconductor layer having dopants of a first type; (ii) a second semiconductor layer having the dopants of the first type on the first semiconductor layer, where the second semiconductor layer is lightly-doped relative to the first semiconductor layer; (iii) first and second column regions spaced from each other in the second semiconductor layer, where the second column region is arranged between two of the first column regions; and (iv) first and second first sub-column regions laterally arranged in the second column region, where a doping concentration of the first sub-column region decreases in a direction from the first column region to the second sub-column region, and where a doping concentration of the second sub-column region decreases in a direction from the first column region to the first sub-column region.

5 Claims, 8 Drawing Sheets

(51) Int. Cl.
*H01L 29/40* (2006.01)
*H01L 29/739* (2006.01)

(52) U.S. Cl.
CPC ...... *H01L 29/7397* (2013.01); *H01L 29/7802* (2013.01); *H01L 29/1095* (2013.01)

(56) References Cited

U.S. PATENT DOCUMENTS

| | | |
|---|---|---|
| 9,018,062 B2 | 4/2015 | Liao |
| 11,088,274 B2 * | 8/2021 | Liao .................... H01L 29/0634 |
| 2003/0219933 A1 | 11/2003 | Yamauchi et al. |
| 2008/0017920 A1 | 1/2008 | Sapp et al. |
| 2010/0044791 A1 | 2/2010 | Hebert |
| 2014/0097517 A1 | 4/2014 | Moens et al. |
| 2014/0225217 A1 * | 8/2014 | Kitamura .......... H01L 21/26586 257/487 |
| 2014/0284703 A1 | 9/2014 | Liao |

* cited by examiner

SEMICONDUCTOR DEVICE STRUCTURE AND METHOD FOR MANUFACTURING THE SAME

RELATED APPLICATIONS

This application is a continuation of the following application, U.S. patent application Ser. No. 14/864,340, filed on Sep. 24, 2015, and which is hereby incorporated by reference as if it is set forth in full in this specification, and which also claims the benefit of Chinese Patent Application No. 201410578050.8, filed on Oct. 24, 2014, which is incorporated herein by reference in its entirety.

FIELD OF THE INVENTION

The present disclosure generally relates to the field of semiconductor power electronics, and more particularly to semiconductor device structures, and associated methods.

BACKGROUND

A power switch can include a metal-oxide-semiconductor field-effect transistor (MOSFET), an insulated-gate-bipolar transistor (IGBT), or any other type of transistor or switching device. Generally, MOSFET may have planar structure and vertical structure. In vertical structure, one side of a semiconductor substrate may form a source region, and the other side may form a drain region. Also, a gate conductor can be extended into the semiconductor substrate, and be separated from the semiconductor substrate by a gate dielectric. The power switch can be part of a switched-mode power supply (SMPS), or a "switching" power supply, which have a wide variety of applications in modern electronics. For example, switching power supplies can be used to drive light-emitting diode (LED) loads.

SUMMARY

In one embodiment, a semiconductor device structure can include: (i) a first semiconductor layer having dopants of a first type; (ii) a second semiconductor layer having the dopants of the first type on the first semiconductor layer, where the second semiconductor layer is lightly-doped relative to the first semiconductor layer; (iii) first and second column regions spaced from each other in the second semiconductor layer, where the second column region is arranged between two of the first column regions; and (iv) first and second first sub-column regions laterally arranged in the second column region, where a doping concentration of the first sub-column region decreases in a direction from the first column region to the second sub-column region, and where a doping concentration of the second sub-column region decreases in a direction from the first column region to the first sub-column region.

In one embodiment, a method of making a semiconductor device, can include: (i) providing a first semiconductor layer having dopants of a first type; (ii) forming a second semiconductor layer having dopants of a first type on the first semiconductor layer, where the second semiconductor layer is lightly-doped relative to the first semiconductor layer; (iii) forming a first column region extending from a top surface of the second semiconductor layer to an interior of the second semiconductor layer; and (iv) forming a second column region using a thermal driver and by injecting the dopants of the first type into an opening between two of the first column regions in the second semiconductor layer with an inclination angle, where the second column region includes first and second sub-column regions, where a doping concentration the first sub-column region decreases in a direction from the first column region to the second sub-column region, and where a doping concentration of the second sub-column region decreases in a direction from the first column region to the first sub-column region.

DETAILED DESCRIPTION

Figure 1:
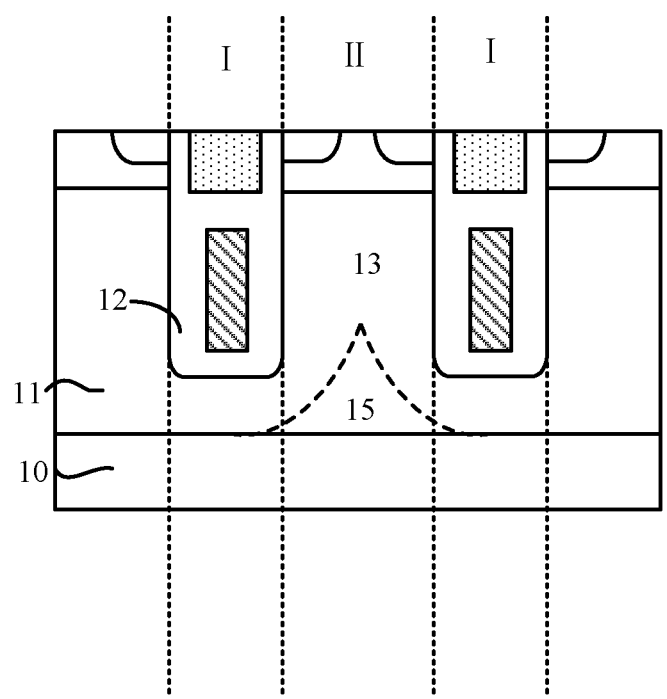
FIG. 1 is a cross-sectional view of an example semiconductor device structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques, such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or "singulating" the finished wafer into the individual die and then packaging the die for structural support and environmental isolation. To singulate the die, the wafer can be scored and broken along non-functional regions of the wafer called saw streets or scribes. The wafer may be singulated using a laser cutting tool or saw blade. After singulation, the individual die can be mounted to a package substrate that includes pins or contact pads for interconnection with other system components. Contact pads formed over the semiconductor die may then be connected to contact pads within the package. The electrical connections can be made with solder bumps, stud bumps, conductive paste, or wirebonds. An encapsulant or other molding material may be deposited over the package to provide physical support and electrical isolation. The finished package can then be inserted into an electrical system, and the functionality of the semiconductor device made available to the other system components.

It should be understood that when one layer or region is referred to as being "above" or "on" another layer or region in the description of the device structure herein, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or "adjoined" to another layer or region, there may not be intervening layers or regions present. Also, when one region is referred to as being "directly in," it can be directly in another region and adjoining another region, but not necessarily in a doping region of another region.

Also as used herein, the term "semiconductor structure" can generally mean the whole semiconductor structure formed at each step of an exemplified method for manufacturing the semiconductor device, including all of the layers and regions having been formed. The term "lateral expansion" as used herein can mean extending along the direction that is substantially perpendicular to the depth direction of a trench. Some particular details of various embodiments will be described below, such as exemplary semiconductor structures, materials, dimensions, process steps and technologies of a semiconductor device. However, it can be understood by one skilled in the art that these details may not always be essential, but rather can be varied in particular implementations.

Referring now to FIG. 1, shown is a cross-sectional view of an example semiconductor device structure. In a vertical structure MOSFET, a trench type of MOSFET can reduce the "on" resistance of the transistor. In this example, a trench MOSFET can include epitaxial semiconductor layer 11 in semiconductor substrate 10, as well as trench 12, and drift region 13 adjacent thereto in epitaxial semiconductor layer 11. For example, trench 12 may extend toward an upper portion of epitaxial semiconductor layer 11 until ending therein. The drift region may be doped with uniform dopants (e.g., the doping concentration of drift region 13 is uniform) in this approach. Therefore, the doping concentration may be relatively high if a lower on resistance for the transistor is required for a given application. In some cases, this can result in distortion of depletion layer 15, and relatively easy breakdown of the device. Thus, the withstand voltage of the MOSFET formed may be reduced.

In one embodiment, a semiconductor device structure can include: (i) a first semiconductor layer having dopants of a first type; (ii) a second semiconductor layer having the dopants of the first type on the first semiconductor layer, where the second semiconductor layer is lightly-doped relative to the first semiconductor layer; (iii) first and second column regions spaced from each other in the second semiconductor layer, where the second column region is arranged between two of the first column regions; and (iv) first and second first sub-column regions laterally arranged in the second column region, where a doping concentration of the first sub-column region decreases in a direction from the first column region to the second sub-column region, and where a doping concentration of the second sub-column region decreases in a direction from the first column region to the first sub-column region.

Figure 2A:
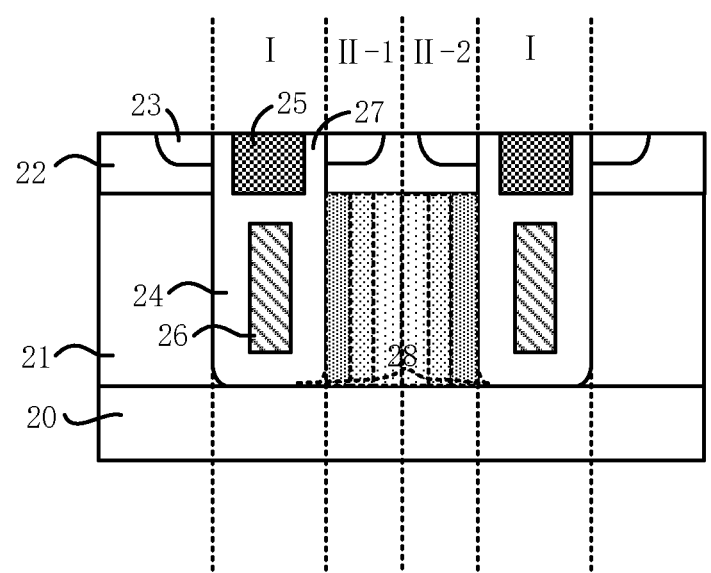
FIG. 2A is a cross-sectional view of a first example semiconductor device structure, in accordance with embodiments of the present invention.

Referring now to FIG. 2A, shown is a cross-sectional view of a first example semiconductor device structure, in accordance with embodiments of the present invention. In this particular example, a first column region (e.g., I) can include a trench (e.g., 24) that extends from an upper portion or surface of the semiconductor layer to the interior thereof, and a second column region (e.g., II) may be a drift region with dopants of a first type (e.g., N-type).

For example, semiconductor substrate 20 may include silicon, and have dopants of the first type (e.g., N-type dopants), and dopants of a "second" type may be P-type dopants. An N-type semiconductor layer or region may be formed by implanting an N-type dopant, such as phosphorous or arsenic, in the semiconductor layer or region. A P-type semiconductor layer or region may be formed by implanting a P-type dopant, such as boron, in the semiconductor layer or region. In one example, semiconductor substrate 20 can be N+ doped.

An epitaxial semiconductor layer 21 with dopants of the first type can lie on the surface of semiconductor substrate or layer 20. For example, epitaxial semiconductor layer 21 can include silicon. Also, epitaxial semiconductor layer 21 can be a lightly-doped layer relative to semiconductor substrate 20. In one example, epitaxial semiconductor layer 21 can be N-doped, and may have a lower doping concentration relative to other approaches or the layer below. Trench 24 can be extended into the interior from epitaxial semiconductor layer 21, and the trench may end in epitaxial semiconductor layer 21. In this particular example, the bottom of the trench can be flush with the bottom of epitaxial semiconductor layer 21. In an alternative example, the trench may extend through epitaxial semiconductor layer 21, and end in semiconductor substrate 20. Further, both of body region 22 and source region 23 can be formed adjacent to the trench.

The bottom of trench 24 may be filled with conducting material to form a shielding conductor 26 that is separated from epitaxial semiconductor layer 21 by an insulating layer. For example, the insulating layer can include at least one oxide layer and at least one nitride layer. In one example, shielding conductor 26 may be made of doped polysilicon. Gate dielectric 27 can be formed at the upper side walls of the trench. In one example, gate dielectric 27 may be an oxide layer (e.g., silicon oxide) with a thickness of from about 25 nanometers to about 150 nanometers. The upper region of the trench may be filled with conducting material to form gate conductor 25.

In some cases, gate conductor 25 may be separated from gate dielectric 27 by epitaxial semiconductor layer 21. In one example, gate conductor 25 can include doped polysilicon. Also, body region 22 with dopants of the second type (e.g., P-type) can be formed in epitaxial semiconductor layer 21. Source region 23 with dopants of the first type (e.g., N-type) can be formed in body region 22. In this particular example, the semiconductor device structure can also include a drift region adjacent to the trench, where the drift region can include a first drift region (e.g., II-1) and a second drift region (e.g., II-2) that are laterally symmetrical to each other. For example, the doping concentration of drift region II-1 can decrease in a direction from the trench to drift region II-2, and the doping concentration of drift region II-2 can decrease in a direction from the trench to drift region II-1.

Figure 2B:
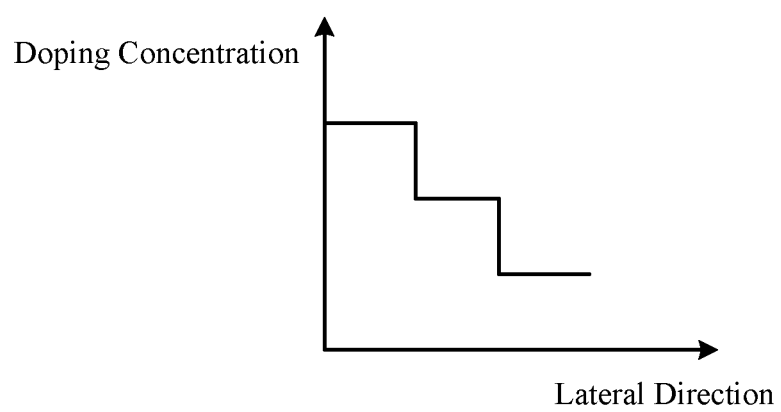
FIG. 2B is a diagram showing a first example concentration variation of a second column region, in accordance with embodiments of the present invention.

Referring now to FIG. 2B, shown is a diagram of a first example concentration variation of a second column region, in accordance with embodiments of the present invention. For example, the doping concentrations of drift regions II-1 and II-2 can change by "steps" as shown whereby the doping concentration of a drift region changes laterally so as to avoid distortion of the depletion layer of a device, and also to protect the device from being easily broken down. The semiconductor device can also include a drain region with dopants of the first type in the drift region, whereby the drain region is in the bottom of the semiconductor substrate.

Figure 2C:
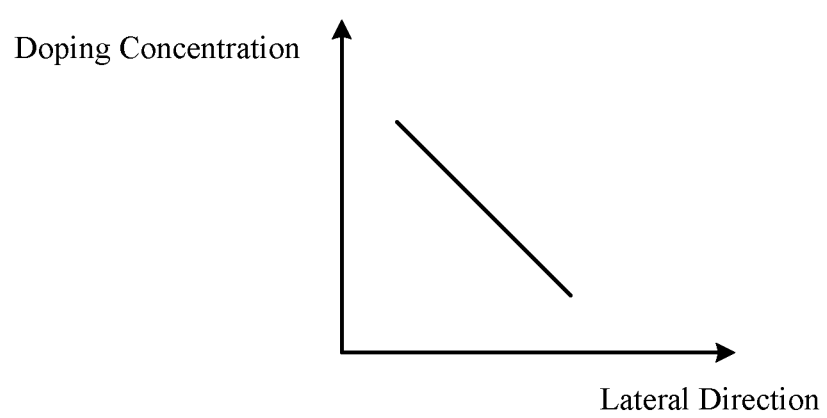
FIG. 2C is a diagram showing a second example concentration variation of a second column region, in accordance with embodiments of the present invention.

Referring now to FIG. 2C, shown is a diagram of a second example concentration variation of a second column region, in accordance with embodiments of the present invention. In this example, the doping concentrations of drift regions II-1 and II-2 can change linearly, such as where the doping concentration of drift region II-1 may linearly decrease in a direction from the trench to drift region II-2, and the doping concentration of drift region II-2 may linearly decrease from the trench to drift region II-1. Moreover, as the semiconductor device in this example can be a symmetrical structure with spaced trenches and drift regions, the doping concentrations of other drift regions outside of the trench can be the same in some cases.

In this particular example, the dopants with variation lateral doping concentrations in the drift region can be injected from above the trench to a remaining portion of the epitaxial semiconductor layer with a certain or predetermined "inclination angle." In this way, the drift region can be formed with a varied concentration by way of a thermal driver. Variation lateral doping may thus be employed in a semiconductor device structure of particular embodiments. Accordingly, depletion layer 28 of this example device can be relatively smooth, and a relatively high withstand voltage can be obtained in order to prevent the transistor device from breakdown. The semiconductor transistor device may have a relatively high doping concentration in a region near the trench, which may not adversely affect the breakdown voltage when the transistor has relatively low. In this fashion, relatively low on resistance and relatively high withstand voltage can be achieved. In addition, the trench can also be filled with a shielding conductor and/or a gate conductor.

Figure 3:
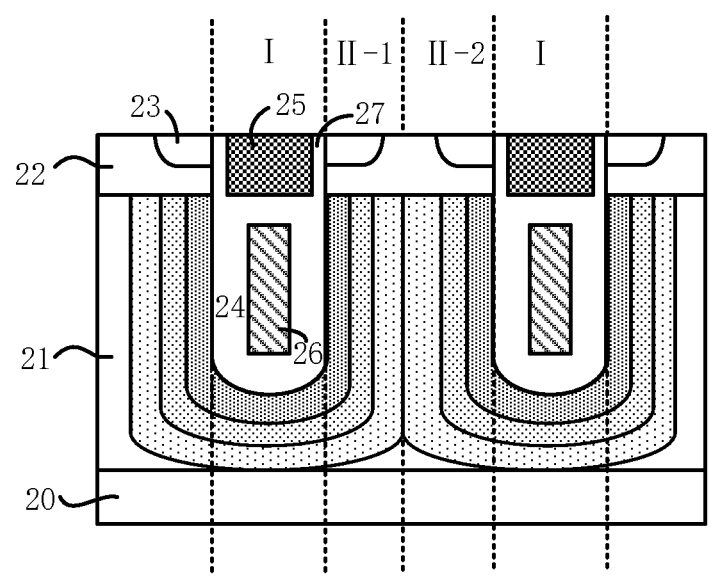
FIG. 3 is a cross-sectional view of a second example of a semiconductor device structure, in accordance with embodiments of the present invention.

Referring now to FIG. 3, shown is a cross-sectional view of a second example of a semiconductor device structure, in accordance with embodiments of the present invention. Here, there may be a certain or predetermined distance between the bottom of trench 24 and the bottom of epitaxial semiconductor layer 21, as opposed to being flush. In this particular example, drift regions with varied doping concentrations may be formed to surround each trench structure. As shown, the doping concentrations may decrease in directions from near the trench to extending away from the trench.

Figure 4:
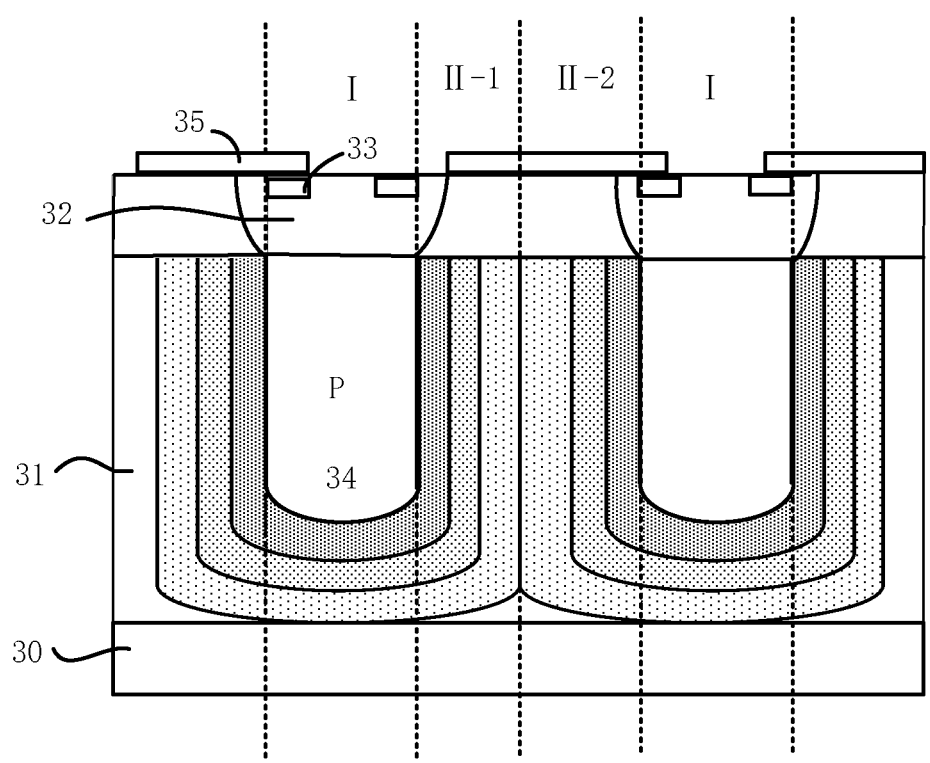
FIG. 4 is a cross-sectional view of a third example of a semiconductor device structure, in accordance with embodiments of the present invention.

Referring now to FIG. 4, shown is a cross-sectional view of a third example of a semiconductor device structure, in accordance with embodiments of the present invention. In this example, variation lateral doping can be applied to other device structures, such as to form a super-junction structure. In this case, column region I can be a drift region with dopants of the second type (e.g., P-type), and column region II can be a drift region with dopants of the first type (e.g., N-type).

For example, semiconductor substrate 30 can include silicon, and may have dopants of the first type (e.g., N-type). Epitaxial semiconductor layer 31 with dopants of the first type (e.g., N-type) can lay on the surface of semiconductor substrate 30. For example, epitaxial semiconductor layer 31 can include silicon, and may be a lightly-doped layer relative to semiconductor substrate 30. Trench 34 can be in column region I in epitaxial semiconductor layer 31, and may be P-type doped. Also, body region 32 with dopants of the second type (e.g., P-type) can be in epitaxial semiconductor layer 31, and may be above column region I. Source region 33 with dopants of the first type (e.g., N-type) can be formed in body region 32.

Column region II can be an N-doped drift region including drift regions II-1 and II-2 that are laterally symmetrical to each other. Also, the doping concentration of drift region II-1 can decrease in a direction from the trench to drift region II-2, and the doping concentration of drift region II-2 can decrease in a direction from the trench to drift region II-1. As described above, the doping concentrations of drift regions II-1 and II-2 can change by steps (see, e.g., FIG. 2B), or linearly (see, e.g., FIG. 2C). The doping concentration of the drift regions can change laterally such that a relatively smooth depletion layer of the transistor/device is obtained in order to protect the device from being easily broken down.

A gate oxide layer can be formed on epitaxial semiconductor layer 31, and gate conductor 35 may be formed on the gate oxide layer. For example, gate conductor 35 can include doped polysilicon. In addition, after the variation lateral doping, the doping concentration of a region near column region I may be higher for relatively low on resistance, in order to achieve a relatively high withstand voltage.

In one embodiment, a method of making a semiconductor device, can include: (i) providing a first semiconductor layer having dopants of a first type; (ii) forming a second semiconductor layer having dopants of a first type on the first semiconductor layer, where the second semiconductor layer is lightly-doped relative to the first semiconductor layer; (iii) forming a first column region extending from a top surface of the second semiconductor layer to an interior of the second semiconductor layer; and (iv) forming a second column region using a thermal driver and by injecting the dopants of the first type into an opening between two of the first column regions in the second semiconductor layer with an inclination angle, where the second column region can include first and second sub-column regions, where a doping concentration the first sub-column region decreases in a direction from the first column region to the second sub-column region, and where a doping concentration of the second sub-column region decreases in a direction from the first column region to the first sub-column region.

Figure 5:
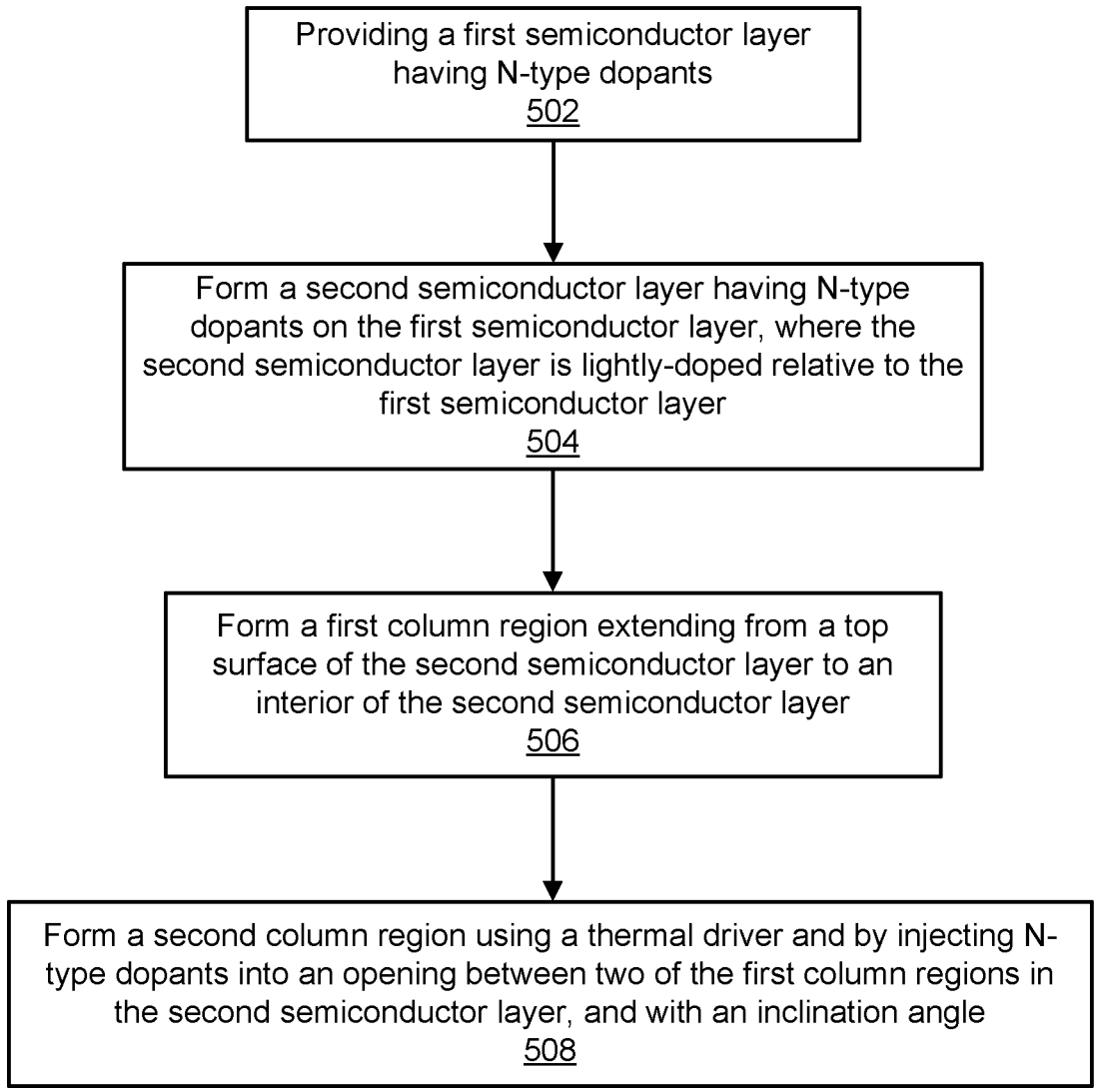
FIG. 5 is a flow diagram of an example method of making a semiconductor device, in accordance with embodiments of the present invention.

Referring now to FIG. 5, shown is a flow diagram of an example method of making a semiconductor device, in accordance with embodiments of the present invention. At 502, a first semiconductor layer (e.g., 30) having dopants of a first type (e.g., N-type) can be provided. At 504, a second semiconductor layer (e.g., 31) having N-type dopants can be formed on the first semiconductor layer. Also, the second semiconductor layer may be a lightly-doped layer relative to the first semiconductor layer. At 506, a first column region (e.g., I) extending from a top surface of the second semiconductor layer to an interior of the second semiconductor layer can be formed.

At 508, a second column region (e.g., II) can be formed by using a thermal driver and injecting the dopants of the first type into an opening between two of the first column regions in the second semiconductor layer with a predetermined inclination angle. In addition, the second column region can include first (e.g., II-1) and second (e.g., II-2) sub-column regions. Also, a doping concentration of the first sub-column region may decrease in a direction from the first column region to the second sub-column region, and a doping concentration of the second sub-column region can decrease in a direction from the first column region to the first sub-column region. In this way, the second column region can be formed with a varied doping concentration.

The first and second semiconductor layers can be formed by any known process. The first column region can be formed, e.g., by etching the second semiconductor layer by using an etching process and by applying a hard mask in order to form the first column region in the second semiconductor layer. The second column region can be formed, e.g., by injecting dopants from above the first column region into a remaining portion of the second semiconductor layer, and with a certain/predetermined inclination angle. The second column region can be formed with varied doping centration by use of a thermal driver. For example, the first column region can include dopants of the second type (e.g., P-type), and the body region can also include P-type dopants. The body region (e.g., 22) can be formed above the second column region, and a source region (e.g., 23) can be formed in the body region. A gate oxide layer (e.g., 27) can be formed above/in the upper surface of the second semiconductor layer (e.g., 21), and a gate conductor (e.g., 25) can be formed above or within the gate oxide layer.

The first column region can include a trench (e.g., 24/34) that is insulated/separated from the second semiconductor layer. The trench can extend from the top surface of the second semiconductor layer (e.g., 21/31) to the interior of the second semiconductor layer. Also, the second column region can be a drift region with dopants of the first type (e.g., N-type). In the trench, a shielding conductor (e.g., 26) can be included with a portion thereof being located at or near the bottom of the trench. The shielding conductor can be insulated, such as by a stacked insulation layer that includes at least one oxide layer and at least one nitride layer in the trench. The gate dielectric (e.g., 27) may be formed at the upper side walls of the trench, and a gate conductor (e.g., 25) can be formed in the trench and located at an upper portion of the trench (see, e.g., FIG. 3). Also, the shielding conductor may be separated from the gate conductor in some cases, or coupled to the gate conductor in other cases. A body region (e.g., 32) with dopants of the second type (e.g., P-type) can be formed in the second semiconductor layer, and source region (e.g., 33) with dopants of the first type (e.g., N-type) can be formed in the body region.

Figure 6:
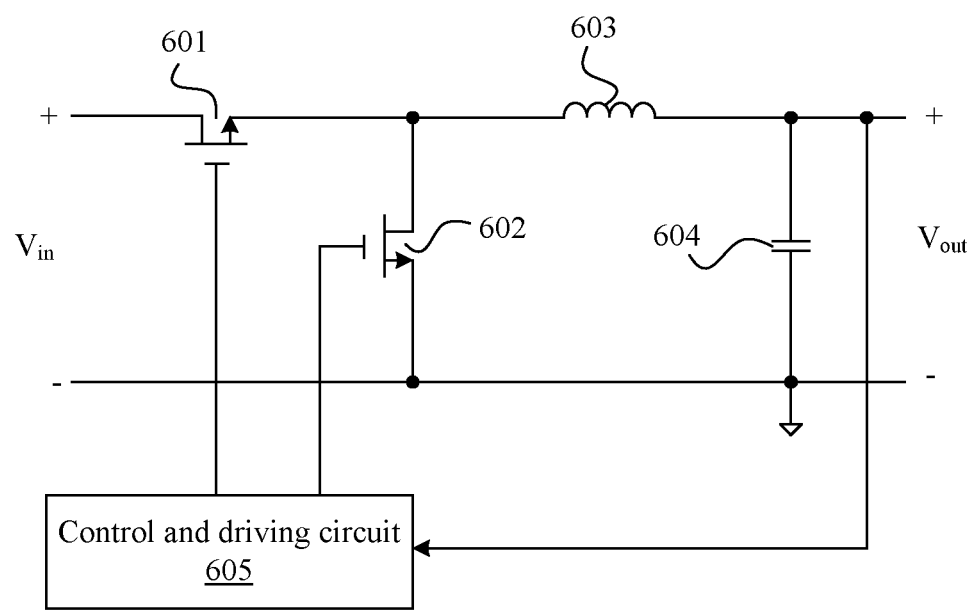
FIG. 6 is a schematic diagram of an example switching voltage regulator, in accordance with embodiments of the present invention.

Referring now to FIG. 6, shown is a schematic diagram of an example switching voltage regulator that includes power devices/structures as described herein. A switching voltage regulator is just one example of the circuitry that can be wholly or partially fabricated in the semiconductor structure and/or using processes of particular embodiments. In this example, power transistors 601 and 602, inductor 603, and capacitor 604 can form a synchronous buck power stage circuit. In other cases, other types of power stage or converter circuits (e.g., flyback, SEPIC, boost, buck-boost, etc.) can be formed. Control and driving circuit 605 (e.g., including a pulse-width modulation [PWM] controller) can receive an output signal of the power stage circuit, to form a closed-loop feedback control loop to control the switching state of power transistors 601 and 602. In this way, the output signal of the power stage circuit can be controlled to be substantially constant.

Of course, other integration or grouping of circuitry into different chips, ICs, or wafers can be accommodated in particular embodiments. In one example, a multi-chip packaging structure in particular embodiments can include power transistors 601 and 602 being integrated into a power device chip, and control and driving circuit 605 being integrated into a control chip. Since the power device may process a high voltage and/or a high current, the power device chip with a large area can be able to withstand a relatively high voltage and a relatively high current. Also, the power device may have good thermal characteristics for power supply integration.

For the integrated circuit of the switching voltage regulator shown in FIG. 6, if the carrying capacity of power transistor 602 is greater than that of power transistor 601, power transistor 602 may be much larger than power transistor 601. Thus, power transistor 602 (e.g., the synchronous power device) can be integrated in a single synchronous power device chip, and power transistor 601 (e.g., the main power device) as well as control and driving circuit 605 can be integrated in another single mixed chip. Further, power transistors 601 and/or 602 can be any suitable types of transistors or devices (e.g., super-junction MOS transistors, VDMOS, LDMOS, IGBT, etc.).

In particular embodiments, a semiconductor device structure may have a relatively low on resistance and high withstand voltage, and may be a metal-oxide-semiconductor-field-effect transistor (MOSFET) manufactured by a trench filling process. The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor device structure, comprising:
   a) a first semiconductor layer having dopants of a first type;
   b) a second semiconductor layer having said dopants of said first type on said first semiconductor layer, wherein said second semiconductor layer is lightly-doped relative to said first semiconductor layer;
   c) first column regions located in said second semiconductor layer;
   d) a second column region located in said second semiconductor layer, wherein said second column region is at least arranged between two of said first column regions; and
   e) a first sub-column region and a second sub-column region laterally arranged in said second column region, wherein a doping concentration of said first sub-column region decreases in a first lateral direction from a first of said two of said first column regions to said second sub-column region, and wherein a doping concentration of said second sub-column region decreases in a second lateral direction from a second of said two of said first column regions to said first sub-column region, wherein said first sub-column region and said second sub-column region have a same dopant type and together laterally extend a full distance between said two of said first column regions in order to increase a breakdown voltage and decrease an on-resistance, wherein said first sub-column region and said second sub-column region are heavily-doped relative to said second semiconductor layer, and wherein each of said first sub-column region and said second sub-column region extends from a top surface of said second semiconductor layer to a full depth of said first column regions.

2. The semiconductor device structure of claim 1, wherein said doping concentrations of said first sub-column region and said second sub-column region decreases by steps.

3. The semiconductor device structure of claim 1, further comprising:
   a) a body region having said dopants of a second type in said second semiconductor layer; and
   b) a source region having said dopants of said first type in said body region, wherein portions of said second column region are located below said source region.

4. The semiconductor device structure of claim 3, wherein each of said first column regions comprises a trench that extends from said top surface of said second semiconductor layer to an interior of said second semiconductor layer, and wherein said trench is filled by an insulating layer and a gate conductor.

5. The semiconductor device structure of claim 1, wherein each of said first column regions extends to a bottom of said second semiconductor layer.

* * * * *